United States Patent [19]

Farnworth et al.

[11] Patent Number: 5,721,496
[45] Date of Patent: Feb. 24, 1998

[54] METHOD AND APPARATUS FOR LEAK CHECKING UNPACKAGED SEMICONDUCTOR DICE

[75] Inventors: Warren M. Farnworth, Nampa; Alan G. Wood, Boise, both of Id.

[73] Assignee: Micron Technology, Inc., Boise, Id.

[21] Appl. No.: 888,857

[22] Filed: Jul. 7, 1997

Related U.S. Application Data

[63] Continuation of Ser. No. 589,943, Jan. 23, 1996, abandoned.

[51] Int. Cl.$^6$ ........................................ G01R 31/02
[52] U.S. Cl. ................................. 324/765; 324/755
[58] Field of Search ....................... 324/750, 765, 324/158.1, 755; 437/8; 257/40, 48

[56] References Cited

U.S. PATENT DOCUMENTS

| | | | |
|---|---|---|---|
| 4,853,628 | 8/1989 | Gouldsberry | 324/158 R |
| 4,899,921 | 2/1990 | Bendat et al. | 228/105 |
| 4,918,385 | 4/1990 | Shreeve | 324/158 R |
| 5,006,792 | 4/1991 | Malhi et al. | 324/158 F |
| 5,030,905 | 7/1991 | Figal | 324/158 R |
| 5,047,711 | 9/1991 | Smith et al. | 324/158 R |
| 5,073,117 | 12/1991 | Malhi et al. | 439/71 |
| 5,088,190 | 2/1992 | Malhi et al. | 29/843 |
| 5,123,850 | 6/1992 | Elder et al. | 439/67 |
| 5,132,612 | 7/1992 | Burns et al. | 324/72.5 |
| 5,367,253 | 11/1994 | Wood et al. | 324/158.1 |
| 5,397,245 | 3/1995 | Roebuck et al. | 439/264 |
| 5,408,190 | 4/1995 | Wood et al. | 324/765 |
| 5,419,807 | 5/1995 | Akram et al. | 156/647.1 |
| 5,451,165 | 9/1995 | Cearley-Cabbiness et al. | 439/71 |
| 5,453,701 | 9/1995 | Jensen et al. | 324/755 |
| 5,456,404 | 10/1995 | Robinette, Jr. et al. | 228/104 |
| 5,519,335 | 5/1996 | Thomas | 324/765 |
| 5,530,376 | 6/1996 | Lim et al. | 324/765 |
| 5,534,785 | 7/1996 | Yoshizaki et al. | 324/755 |

OTHER PUBLICATIONS

Cloud et al., "Equipment, Processes and Methods for High Volume KGD Production", Third Annual Manufacturing Test Conference, Semicon West, 1996.

*Primary Examiner*—Vinh P. Nguyen
*Attorney, Agent, or Firm*—Stephen A. Gratton

[57] ABSTRACT

A method and apparatus for testing an unpackaged semiconductor die for pad leakage current are provided. The method includes: providing a temporary package for a single unpackaged die; assembling the temporary package with the die; placing the package in electrical communication with leak checking circuitry; and then detecting for leakage current. The leak checking circuitry is adapted to apply a voltage through external leads on the temporary package to a pad of the die (e.g., input/output pad). The leak checking circuitry then detects any resultant leakage current from the pad to the substrate, or to a second pad for the die (e.g., $V_{DD}$ pad, $V_{CC}$ pad, power pad).

26 Claims, 5 Drawing Sheets

PROVIDING A TEMPORARY PACKAGE FOR THE DIE

ASSEMBLING THE DIE IN THE TEMPORARY PACKAGE

TESTING A PAD OF THE DIE FOR LEAKAGE CURRENT BY APPLYING A VOLTAGE TO THE PAD AND DETECTING A RESULTANT CURRENT

DISASSEMBLING THE TEMPORARY PACKAGE AND REMOVING THE TESTED DIE

METHOD AND APPARATUS FOR LEAK CHECKING UNPACKAGED SEMICONDUCTOR DICE

CROSS REFERENCE TO RELATED APPLICATIONS

This application is a continuation of application Ser. No. 08/589,943, filed Jan. 23, 1996, now abandoned.

FIELD OF THE INVENTION

This invention relates to semiconductor manufacture and specifically to an improved method for testing unpackaged semiconductor dice for pad leakage.

BACKGROUND OF THE INVENTION

Unpackaged or bare semiconductor dice are used to construct multi chip modules and other electronic devices. Unpackaged dice must be tested and burned in during the manufacturing process to certify each die as a known good die. This has led to the development of test carriers that hold a single bare die for testing and also provide the electrical interconnection between the pads on the die and external test circuitry. Exemplary test carriers are disclosed in U.S. Pat. No. 5,302,891 to Wood et al. and U.S. Pat. No. 5,408,190 to Wood et al.

One type of defect that affects semiconductor dice is referred to as pad leakage. Pad leakage can occur from the input and output pads of a die to other pads on the die such as the power pads, ground pads and bias voltage pads. Pad leakage can also occur from a pad to the silicon substrate of a die or to another component of the die. One cause of pad leakage can be from defective or damaged electrostatic discharge (ESD) circuits formed on the die.

These protective ESD circuits are typically located between the input and output pads on the die and the transistor gates to which the pads are electrically connected. The ESD circuits provide a path from the input/output pads to a ground pad, or to a power or bias voltage pad, for the die. This electrical path is designed to be actuated by a high voltage, such as an electrostatic discharge, being applied to the input or output pads of the die. Sometimes the ESD circuits are defective, or damaged, and current applied to an input or output pad can leak from the pad through the ESD circuit to another pad on the die or to the substrate. Besides ESD circuits, there can be other defective components which can cause leakage current from the pads on the die.

Although packaged semiconductor dice are routinely checked for pad leakage, unpackaged dice have not heretofore been leak tested during the manufacturing process. In view of the foregoing, it is an object of the present invention to provide a method and apparatus for leak checking the pads of unpackaged semiconductor dice. It is another object of the present invention to provide a method and apparatus for leak checking the pads of unpackaged semiconductor dice using a temporary package for a single bare die constructed with an outline substantially equivalent to a conventionally packaged semiconductor die. Other objects, advantages and capabilities of the present invention will become more apparent as the description proceeds.

SUMMARY OF THE INVENTION

In accordance with the present invention, a method and apparatus for leak checking the pads of an unpackaged semiconductor die are provided. The method broadly stated, includes the steps of: assembling an unpackaged die in a temporary package; testing pads on the die for leakage current using the temporary package and leak checking circuitry; and then disassembling the temporary package and removing the tested die.

The temporary package includes external leads which in the assembled package are in electrical communication with the pads on the die. For detecting leakage current from the pads, the temporary package is electrically connected to a socket, or other mating electrical component, in electrical communication with the leak checking circuitry. The leak checking circuitry is adapted to apply a voltage to a pad of the die (e.g., input/output pad) and to measure any resultant leakage current through the pad. This leakage current can be through the substrate of the die or through a second pad on the die (e.g., ground pad, power pad, DC bias pad, etc.).

In addition to external leads, the temporary package includes a base, an interconnect and a force applying mechanism. The package base is formed of an electrically insulating material such as plastic or ceramic and can have an outline substantially equivalent to a conventionally packaged semiconductor die. The interconnect for the package is mounted to the base and can be wire bonded to the conductors formed on the package base. In an illustrative embodiment, the interconnect is formed of silicon and includes conductive lines and raised contact members that contact and establish electrical communication with the pads on the die. The force applying mechanism for the package includes a pressure plate, a spring and a cover. The force applying mechanism functions to secure the die within the base and to maintain the die and interconnect in electrical contact. The force applying mechanism is secured to the base with a latching mechanism.

Initially the temporary package is assembled by optically aligning and placing the die and the interconnect in contact, and attaching the force applying mechanism to the package base. Using the assembled package, functional and burn in tests can be performed on the die prior to leak checking. The temporary package can then be electrically connected to the leak checking circuitry and the pads on the die leak tested.

DETAILED DESCRIPTION OF THE PREFERRED EMBODIMENT

Figure 1:
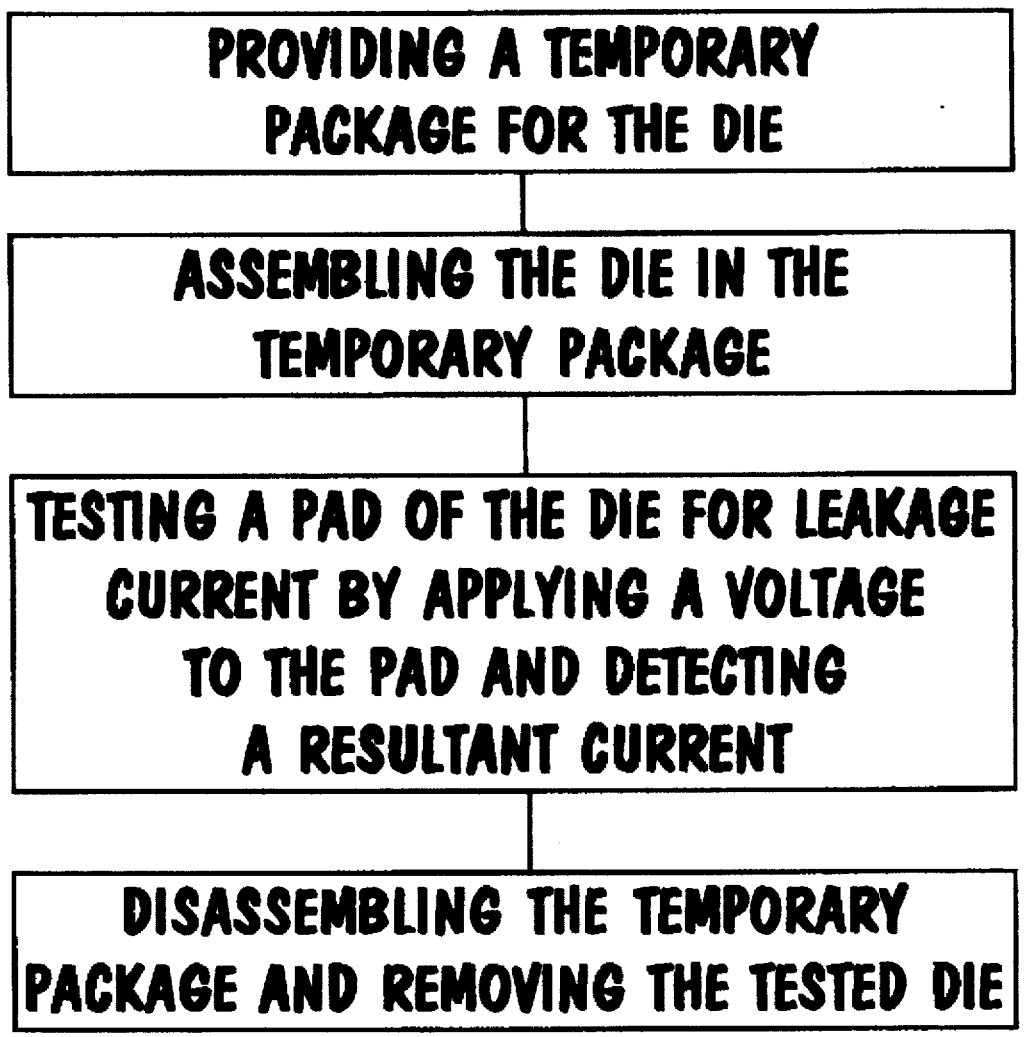
FIG. 1 is a flow diagram illustrating broad steps in the method of the invention.

As used herein, the term "pad" refers to an external pad formed on a semiconductor die in electrical communication with the integrated circuits and devices on the die. An external pad can be a flat or a bumped bond pad or a test pad for the die. With reference to FIG. 1, a method for leak checking the pads of an unpackaged semiconductor die includes the broad steps of:

provoiding a temporary package for the die;

assembling the die in the temporary package;

testing a pad of the die for leakage current by applying a voltage to the pad and detecting a resultant current through the pad; and disassembling the temporary package and removing the tested die.

Figure 2:
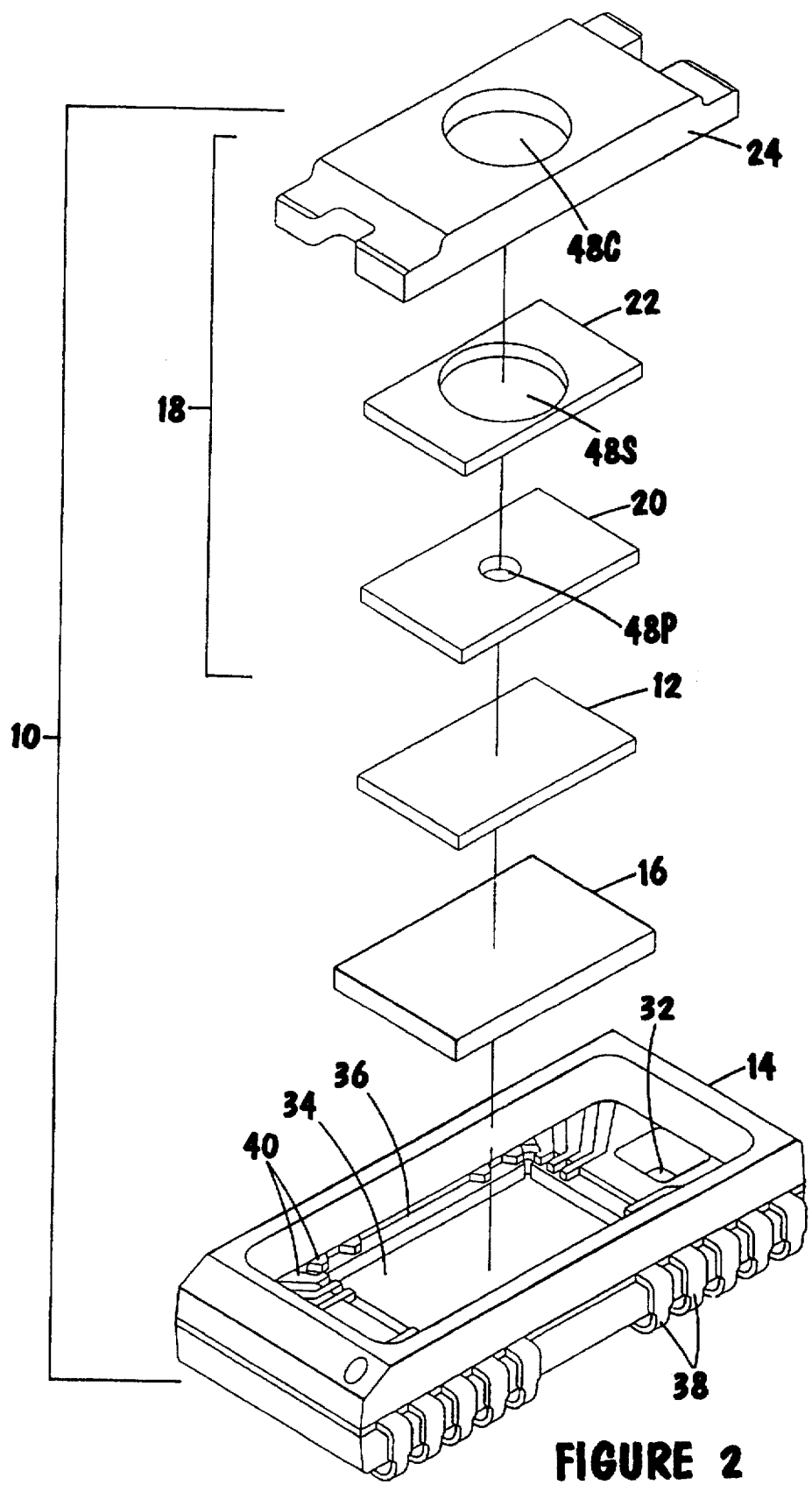
FIG. 2 is an exploded perspective view of a temporary package for leak checking an unpackaged semiconductor die in accordance with the invention.

One suitable temporary package 10 for performing the method of the invention is shown in FIG. 2. The temporary package 10 includes a package base 14, an interconnect 16, and a force applying mechanism 18. The interconnect 16 establishes electrical communication between the package base 14 and the die 12. The force applying mechanism 18 secures the die 12 to the package base 14 and presses the die 12 against the interconnect 16. The force applying mechanism 18 includes a pressure plate 20, a spring 22 and a cover 24. The package 10 also includes a latching mechanism in the form of clips 26, 28 (FIG. 2A) which secure the force applying mechanism 18 to the package base 14.

In the illustrative embodiment, the package 10 has an outline that is substantially equivalent to the outline of a conventional semiconductor package. As used herein, the term "conventional semiconductor package" refers to a plastic or ceramic package having a size and external lead configuration that conforms to standards of a recognized industry standard setting body. These standard setting bodies can include:

EIA/JEDEC—Electronics Industry Association—Joint Electron Device Engineering Council JEIDA—Japanese Electronics Industry Development Association PCMCIA—Personal Computer Memory Card International Association In the illustrative embodiment, the package 10 is constructed as a small outline package with J-bend external leads 38. This standard outline permits the package 10 to be burned-in using standardized burn-in equipment for a conventional small outline J-bend (SOJ) package.

The external dimensions and outline of the assembled package 10, as well as the dimensions and configuration of the external leads 38 for the package 10, can be according to JEDEC standards. For example, for an SOJ configuration, the package 10 can be formed with a width of from about 0.301 to 0.313 inches, a thickness of from about 0.105 to 0.109 inches and a length of from about 0.675 to 0.691 inches. The J-bend leads 38 can be formed with a minimum width of about 0.018 inches, on a pitch of about 0.048 to 0.052 inches and with a spacing between the center lines of the leads 38 on the opposite sides of the package 10 of about 0.260 to 0.275 inches.

The package 10 can also be constructed with a standard outline and external leads equivalent to other conventional plastic or ceramic semiconductor packages. These package configurations can include:

DIP (dual in line package)

ZIP (zig zag in line package)

LCC (leadless chip carrier)

SOP (small outline package)

QFP (quad flat pack)

TSOP (thin small outline package)

SOJ (small outline j-bend)

PGA (pin grid array)

LGA (land grid array)

BGA (ball grid array)

The package base 14 can be formed of an electrically insulating material such as plastic or ceramic. Suitable processes for forming the package base 14 are described in co-pending U.S. Pat. No. 5,519,332 which is incorporated herein by reference.

Figure 2A:
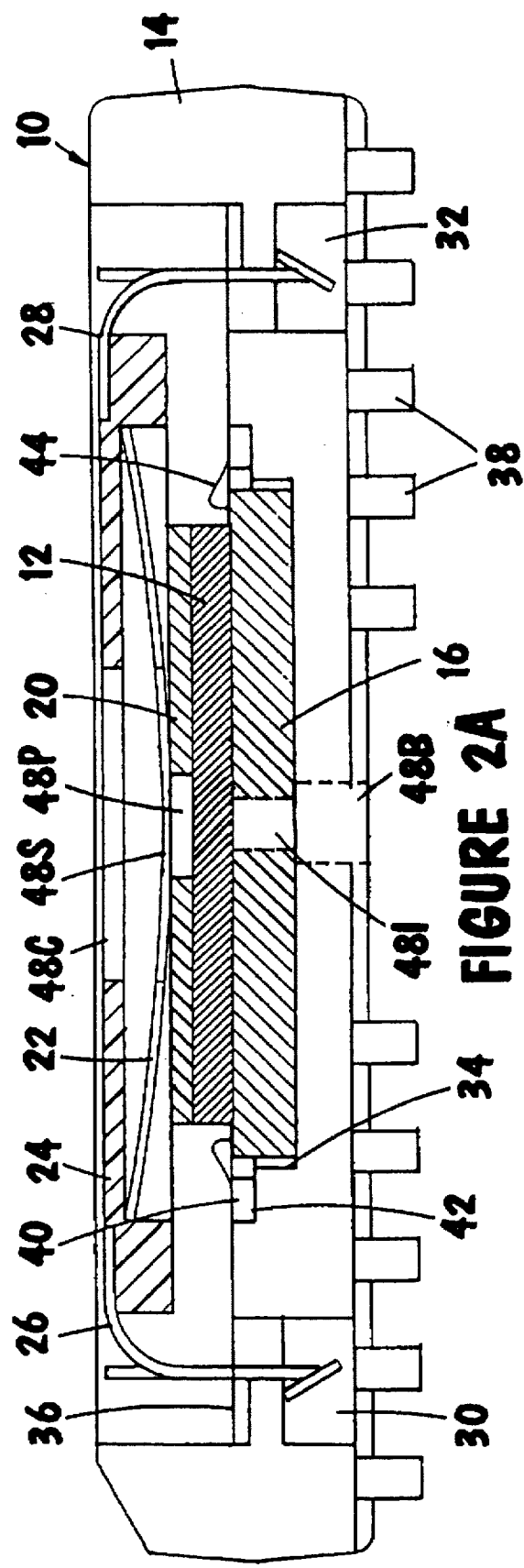
FIG. 2A is a cross sectional view of the assembled temporary package.

As shown in FIG. 2A, in the assembled package 10, the die 12 is held within a recess 36 formed within the package base 14 and is sandwiched between the interconnect 16 and the cover 24. The interconnect 16 is also mounted within a recess 34 formed within the package base 14. As also shown in FIG. 2A, in the assembled package 10, the pressure plate 20 overlies the die 12, and the spring 22 presses the pressure plate 20 and the die 12 against the interconnect 16.

Still referring to FIG. 2A, the clips 26, 28 attach to corresponding openings 30, 32 in the base 14 to secure the cover 24, spring 22 and pressure plate 20 of the force applying mechanism 18 and the die 12 within the package base 14. The clips 26, 28 can be formed of a flexible material such as spring steel, or plastic, and are shaped to exert a retention force on the cover 24. Furthermore, in the assembled package 10, the cover 24 is recessed below the top surface of the package base 14. The outer peripheral size and outline of the package 10 are thus substantially determined by the outer peripheral size and outline of the package base 14.

The cover 24, spring 22 and pressure plate 20 all include a central opening which are designated 48C, 48S and 48P respectively. The openings 48C, 48S and 48P are used during assembly of the package 10 to permit the die 12 to be held by a vacuum tool (not shown) during optical alignment of the die 12 and interconnect 16. In a similar manner, a vacuum tool (not shown) can be used to disassemble the package 10. In addition, an opening 48B can be provided through the package base 14 and an opening 48I can be provided through the interconnect 16. If provided, the openings 48B and 48I permit a vacuum to be directed at the die 12 to allow retaining the die 12 in place during assembly of the temporary package 10.

Figure 2B:
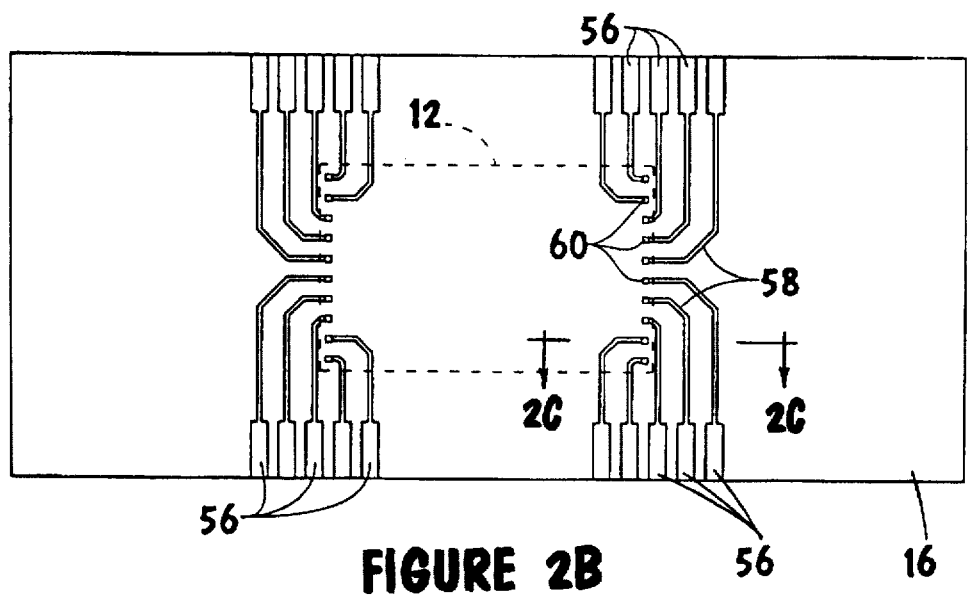
FIG. 2B is a plan view of an interconnect component for the temporary package.
Figure 2C:
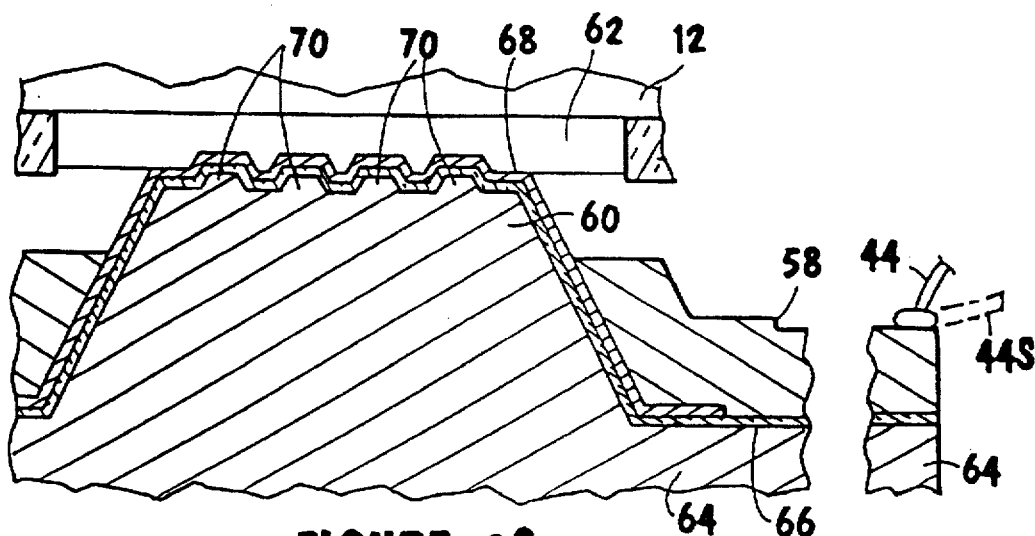
FIG. 2C is a cross sectional view taken along section line 2C—2C of FIG. 2B.

As also shown in FIG. 2A, the interconnect 16 for the package 10 can be wire bonded to conductors 40 on the package base 14 and to bonding sites 56 (FIG. 2B) on the interconnect 16 using bond wires 44. As shown in FIG. 2B, the interconnect 16 includes conductive traces 58 and raised contact members 60. As shown in FIG. 2C, the raised contact members 60 are adapted to contact and establish an electrical connection with the pads 62 on the die 12. In addition, the raised contact members 60 can include penetrating projections 70 formed as elongated blades adapted to penetrate the pads 62 on the die 12 to a self limiting penetration depth.

The interconnect 16 and raised contact members 60 can be formed by etching a silicon substrate 64. An insulating layer 66 and a conductive layer 68 are formed on the substrate 64 atop the raised contact members 60. The conductive layer 68 is in electrical communication with the conductive traces 58 and bonding sites 56 which are wire bonded to bond wires 44. Alternately, in place of wire bonding, an electrical connection can be formed to the conductive traces 58 with slide contacts 44S.

A suitable process for forming the contact members 60 substantially as shown is disclosed in U.S. Pat. No. 5,326,428 and U.S. Pat. No. 5,419,807 which are incorporated herein by reference. Another suitable process is disclosed in U.S. Pat. No. 5,483,741, incorporated herein by reference.

Figure 2D:
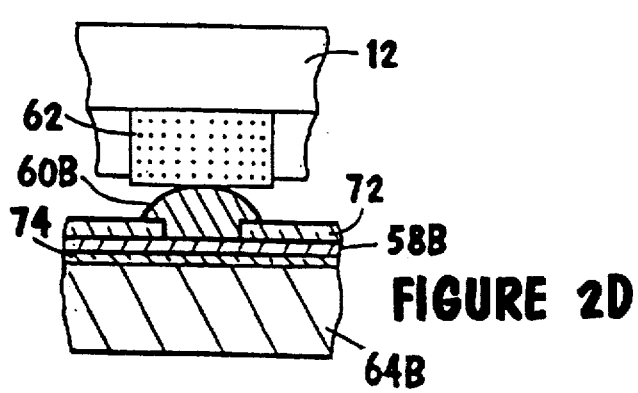
FIG. 2D is cross sectional view equivalent to FIG. 2C of an alternate embodiment interconnect component.

With reference FIG. 2D, alternately the interconnect 16 can also be formed with microbump contact members 60B and conductive traces 58B formed on a plastic film 72. The microbump contact members 60B and plastic film 72 can be similar to two layer TAB tape such as ASMAT manufactured by Nitto Denko. The plastic film 72 can be mounted to a substrate 64B such as silicon using a compliant adhesive layer 74. The compliant adhesive layer 74 can be formed of a silicone elastomer, an epoxy or a polyimide material. One method for forming an interconnect with microbump contact members is described in previously cited U.S. Pat. No. 5,510,332.

Referring again to FIG. 2, the package 10 can be assembled using optical alignment techniques and aligner bonder tools used for flip chip bonding semiconductor dice. Flip chip bonding refers to a process wherein a semiconductor die is placed face down on a substrate, such as a printed circuit board, and the bond pads on the die are bonded to connection points on the substrate. Tools for flip chip bonding are sometimes referred to as aligner bonders. An aligner bonder and method of optical alignment for flip chip bonding are described in U.S. Pat. No. 4,899,921 to Bendat et al, entitled "Aligner Bonder". Such an aligner bonder is available from Research Devices of Piscataway, N.J.

In the present case, an aligner bonder may be modified to provide an assembly apparatus for use in assembling the package 10. The assembly apparatus includes an assembly tool (not shown) that is adapted to retain the force applying mechanism 18 (FIG. 2), die 12 and clips 26, 28 (FIG. 2A). The components of the force applying mechanism 18 include the openings 48C, 48S, 48P which allow a vacuum wand (not shown) of the assembly tool to hold the die 12. With the die 12 held by the assembly tool, the pads 62 (FIG. 2C) on the die 12 are aligned with the contact members 60 (FIG. 2C) on the interconnect 16. The assembly tool then places the die 12 in contact with the interconnect 16 and secures the clips 26, 28 (FIG. 2A) to the openings 30, 32 in the package base 14. A vacuum directed through openings 48I and 48B (FIG. 2A) can be used to hold the die 12 in place during attachment of the force applying mechanism 18.

U.S. Pat. No. 5,634,267, incorporated herein by reference, describes an automated apparatus suitable for optically aligning the die 12 and interconnect 16 and securing the force applying mechanism 18 to the package base 14.

Figure 3:
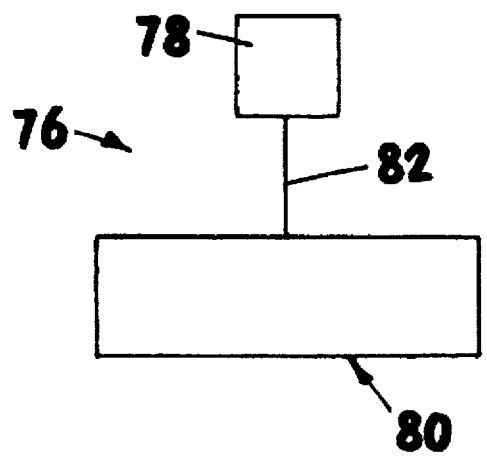
FIG. 3 is a schematic diagram of a leak testing apparatus for performing a leak checking step for the method illustrated in FIG. 1.
Figure 4:
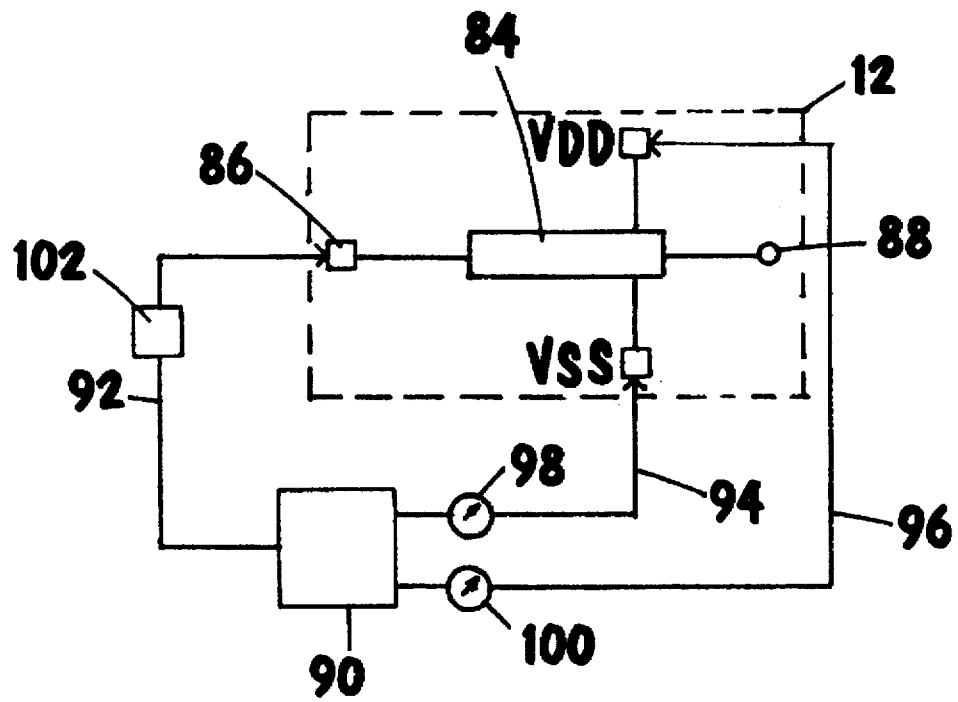
FIG. 4 is an electrical schematic diagram of a circuit for leak checking the pads of an unpackaged semiconductor die.

Referring now to FIGS. 3 and 4, a leak testing apparatus 76 for leak checking the pads 62 of the temporarily packaged die 12 are shown. As shown in FIG. 3, the leak testing apparatus 76 includes a socket 78 that is in electrical communication with cabling 82 and with leak checking circuitry 80.

The socket 78 is adapted to hold the package 10 and to establish electrical communication between the external leads 38 (FIG. 2) on the package 10 and the leak checking circuitry 80. As such, the socket 78 can include female electrical connectors that electrically connect the external leads 38 (FIG. 2) on the package 10 and the cabling 82 to the leak checking circuitry 80. Since the external leads 38 on the temporary package 10 are in electrical communication via the interconnect 16 with the pads 62 on the die 12, the pads 62 are thus in electrical communication with the leak checking circuitry 80.

With reference to FIG. 4, the leak checking circuitry 80 is adapted to test the die 12 for leakage current from the pads 62 (FIG. 2C) for the die. As used herein, "leakage current" denotes an undesirable electrical path from a pad of the die 12 (e.g., input/output pad) to the substrate, to a second pad of the die (e.g., power pad, ground pad, DC bias pad), or to another component of the die. Leakage current, for example, can result from a defective or damaged ESD circuit or other defective or damaged electrical component on the die 12. FIG. 4 illustrates the method of the invention in connection with an exemplary ESD circuit 84 formed on the die 12. However, the ESD circuit 84 is only one example of an electrical circuit on the die 12 that can cause leakage current through a die pad 62 (FIG. 2C).

In FIG. 4, the ESD circuit 84 is located between the input/output pads 86 for the die 12 and the gate elements 88 for transistors formed on the die 12. The ESD circuit 84 is adapted to provide an electrical path to the ground pad ($V_{ss}$) or to the DC bias pad ($V_{DD}$) should an ESD voltage be applied to the input/output pad 86.

As shown in FIG. 4, the leak checking circuitry 80, includes a power supply 90 and a conductive line 92 that is in electrical communication with the input/output pad 86 on the die 12. The power supply 90 is preferably a constant current source. In addition, the leak checking circuitry 80 includes a conductive line 94 in electrical communication with the $V_{ss}$ pad on the die 12. Another conductive line 96 is in electrical communication with the $V_{DD}$ pad on the die 12.

The leak checking circuitry 80 also includes ammeters 98, 100 located in the electrical path of conductive lines 94 and 96 respectively. By applying a voltage to the input/output pad 86 of the die 12, any leakage current from the input/output pad 86 to the $V_{DD}$ or $V_{ss}$ pads of the die 12 can be detected by the ammeters 98, 100. Furthermore, an ammeter or sensing circuit 102 can be located in conductive line 92. The sensing circuit 102 can be used in place of or in conjunction with the ammeters 98, 100 to detect leakage from the input/output pad 86 to another pad or to the substrate or other component of the die 12. Using the sensing circuit 102, and upon application of a constant current by the power supply 90, any leakage current through the input/output pad 86 can be detected.

Following the test procedure, the package 10 can be disassembled using an assembly tool (not shown) to remove the clips 26, 28 and force distribution mechanism 18, substantially as previously described for the assembly procedure. Advantageously the leak checking circuitry 80 can be located at the disassembly site for the package 10.

While the invention has been described with reference to certain preferred embodiments, as will be apparent to those skilled in the art, certain changes and modifications can be made without departing from the scope of the invention as defined by the following claims.

What is claimed is:

1. A method for testing a semiconductor die comprising:
   providing a leak checking circuit;
   providing a temporary package configured to establish electrical communication between the die and the leak checking circuit, and between the die and burn-in equipment;
   assembling the die in the temporary package;
   burn-in testing the die using the temporary package and burn-in equipment;
   following burn-in testing placing the temporary package in electrical communication with the leak checking circuit;
   testing a pad of the die for leakage current by applying a voltage through the temporary package to the pad and detecting a resulting current using the leak checking circuit; and disassembling the temporary package and removing the die.

2. The method as claimed in claim 1 wherein the temporary package includes an external lead and further comprising placing the lead in electrical communication with the pad during the assembling step and with the leak checking circuit during the testing step.

3. The method as claimed in claim 1 wherein the leak checking circuit includes a socket and the temporary package electrically engages the socket.

4. The method as claimed in claim 1 wherein the testing and disassembling steps are performed at a same site.

5. The method as claimed in claim 1 wherein the temporary package comprises a plurality of external leads in a configuration of a conventional semiconductor package.

6. A method for testing a semiconductor die, comprising:

providing a leak checking circuit;

providing a temporary package for the die, said package comprising a plurality of leads configured to establish electrical communication between the die and the leak checking circuit, and between the die and burn-in equipment;

assembling the die in the package with pads on the die electrically connected to the leads;

burn-in testing the die using the package and burn-in equipment;

following burn-in testing, placing the leads in electrical communication with the leak checking circuit, then applying a voltage through the leads to the pads, and sensing a leakage current; and disassembling the package and removing the die.

7. The method as claimed in claim 6 wherein the applying and disassembling steps are performed at a same site.

8. The method as claimed in claim 6 wherein the leak checking circuit comprises a constant current source.

9. The method as claimed in claim 6 wherein the leads are in a configuration of a conventional semiconductor package.

10. The method as claimed in claim 9 wherein the conventional semiconductor package comprises a plastic or ceramic package selected from the group consisting of DIP (dual in line package), ZIP (zig zag in line package), LCC (leadless chip carrier), SOP (small outline package), QFP (quad flat pack), TSOP (thin small outline package), SOJ (small outline j-bend), PGA (pin grid array), LGA (land grid array) and BGA (ball grid array).

11. The method as claimed in claim 6 wherein the temporary package comprises a base for retaining the die, an interconnect having a penetration limiting contact member for establishing electrical communication between the pad and lead, and a force applying mechanism for maintaining the die and interconnect in electrical contact.

12. A method for testing a semiconductor die comprising:

providing a temporary package for the die, said package comprising a lead and an interconnect for establishing electrical communication between a pad on the die and the lead, said pad in electrical communication with an electrostatic discharge circuit on the die;

assembling the die in the temporary package;

burn-in testing the die using the temporary package and burn-in equipment;

providing a leak checking circuit configured for electrical communication with the lead, said leak checking circuit comprising a current source and a current sensing circuit;

following burn-in testing placing the lead of the package in electrical communication with the leak checking circuit;

testing the pad for current leakage using the leak checking circuit; and disassembling the die from the package.

13. The method as claimed in claim 12 wherein the testing the pad step is performed at a same site as the disassembling the die step.

14. The method as claimed in claim 12 wherein the temporary package includes a plurality of leads in a configuration equivalent to a conventional semiconductor package.

15. The method as claimed in claim 12 wherein the temporary package includes a plurality of leads in a configuration equivalent to a plastic or ceramic package selected from the group consisting of DIP (dual in line package), ZIP (zig zag in line package), LCC (leadless chip carrier), SOP (small outline package), QFP (quad flat pack), TSOP (thin small outline package), SOJ (small outline j-bend), PGA (pin grid array), LGA (land grid array) and BGA (ball grid array) to permit the burn-in testing step to be performed with standardized burn-in equipment.

16. The method as claimed in claim 12 wherein the lead for the package comprises a J-bend lead.

17. The method as claimed in claim 12 wherein the temporary package comprises a base for retaining the die, and a force applying mechanism for maintaining the die and interconnect in electrical contact.

18. The method as claimed in claim 17 wherein the force applying mechanism comprises a pressure plate, a spring and a cover for biasing the interconnect against the die.

19. An apparatus for testing a semiconductor die comprising:

a temporary package comprising a plurality of leads configured for electrical communication with burn-in equipment, said package further comprising an interconnect having a plurality of contact members configured to place a plurality of pads on the die in electrical communication with the leads; and a leak checking circuit comprising a socket configured to electrically connect to the leads, said leak checking circuit comprising a current source and a current sensing circuit for detecting leakage current through the pads.

20. The apparatus as claimed in claim 19 wherein the temporary package has an outline of a conventional semiconductor package.

21. The apparatus as claimed in claim 19 wherein the leads have a configuration of a conventional semiconductor package selected from the group consisting of DIP (dual in line package), ZIP (zig zag in line package), LCC (leadless chip carrier), SOP (small outline package), QFP (quad flat pack), TSOP (thin small outline package), SOJ (small outline j-bend), PGA (pin grid array), LGA (land grid array) and BGA (ball grid array) to permit burn-in testing using standard burn-in equipment.

22. The apparatus as claimed in claim 19 wherein the contact members include penetrating projections adapted to penetrate the pads on the die to a limited penetration depth.

23. The apparatus as claimed in claim 19 wherein each contact member comprises a microbump on a thin film mounted to a substrate.

24. The apparatus as claimed in claim 19 wherein the temporary package comprises a base for holding the die and interconnect and a force applying mechanism for biasing the die and interconnect together.

25. The apparatus as claimed in claim 24 wherein the force applying mechanism includes a latching mechanism.

26. The apparatus as claimed in claim 25 wherein the latching mechanism includes clips configured for attachment to the base.

* * * * *